INVENTOR.
REINHARD DAHLBERG
BY
Francis L. Masselle
ATTORNEY

INVENTOR.
REINHARD DAHLBERG
BY
Francis [signature]
ATTORNEY

United States Patent Office 3,200,468

Patented Aug. 17, 1965

3,200,468
METHOD AND MEANS FOR CONTACTING AND MOUNTING SEMICONDUCTOR DEVICES

Reinhard Dahlberg, Gundelfingen, near Freiburg, Germany, assignor to Clevite Corporation, a corporation of Ohio Filed Mar. 16, 1962, Ser. No. 180,251
Claims priority, application Germany, Mar. 17, 1961, J 19,618
9 Claims. (Cl. 29—25.3)

This invention relates in general to junction-type semiconductor devices and in particular to means and methods for mounting, providing electrode contacts, and terminal connections for such devices.

The trend of the development of semiconductor devices, especially in the case of devices for high frequency operation, has led and continues in the direction of ever-decreasing dimensions with a concomitant increase in the difficulties involved in handling and fabrication.

In commercial production of such devices it is essential, in the interests of efficiency, to employ techniques which can be simultaneously applied to large numbers of devices. The copending application of Reinhard Dahlberg, Serial No. 83,726, filed January 19, 1961 (now abandoned), and assigned to the same assignee as the present invention, describes a semiconductor device fabrication process in which a plate of semiconductor material has one surface subdivided into a large number of individual device regions by a system of intersecting depressions; semiconductor devices are formed on each of these regions before the plate is eventually cut along the lines of the intersecting depressions to separate the individual units.

After separation of the devices, however, there still remains the need for contacting the respective junctions and base electrodes and providing suitable terminal connections.

Heretofore, the application of base and junction contacts has been carried out individually on each semiconductor device. One commonly employed technique is that known as thermo-compression bonding: the lead wire is placed in contact with the electrode of the device and secured thereto by the application of heat and pressure.

This technique has various disadvantages. While it can be mechanized, it requires relatively costly equipment and, nevertheless, it remains basically a single-unit process; as such it constitutes a bottle neck in any mass production system. Furthermore, the pressure involved, though relatively small, must be set and applied with great precision; excessive pressures have deleterious effects on the properties of the semiconductor device and a relatively high rejection rate frequently attends the use of this technique.

The fundamental general object of the present invention is to overcome or at least mitigate one or more of the problems of the prior art as outlined above.

A more specific object is the provision of novel methods for installing contacts and terminal connections on semiconductor devices which are applicable to large numbers of devices simultaneously.

Another object is the provision of improved methods for applying contacts and terminal connections to semiconductor devices which do not involve the application of pressure to the devices.

Still another object is the provision of novel mounting methods and structures for semiconductor devices.

A further object of the invention is the provisioin of methods for fabricating semiconductor devices which facilitate their mass production and reduce the percentage of defective units.

These and additional objects are attained by methods of fabricating semiconductor devices in accordance with the present invention which comprise providing a plate of semiconductor material having depressions on a major surface subdividing the surface into a plurality of individual coplanar surface regions and further having on each surface region at least one operatiing electrode. A coating of electrically insulating material is then applied to the surface regions contiguous with but leaving at least a portion of the electrodes exposed. A strip of electrically-conductive material is overlaid on the coating of insulating material on each surface region with one end in contact with the electrode and the other end extending toward the edge of the surface region. The major surface of the plate is then coated entirely with an etch-resistant material filling the depressions and subsequently the opposite major face of the plate is etched away until the etch-resistant material in the depressions is reached, thereby effectively separating the plate into discrete semiconductor units.

In accordance with another of its features, the invention contemplates semiconductor devices comprising a wafer of semiconductor material having a major surface; an electrode on the major surface; a coating of insulating material on the major surface contiguous with the electrode and extending continuously in at least one direction from the electrode to an edge of the wafer; and a strip of electrically conductive material overlaid on the insulating material with one end in contact with the electrode and the opposite end extending over the insulating material to the edge of the wafer. The wafer is disposed in a planiform mounting structure having a recess in one major surface adapted to receive the wafer and having on the same major surface an overlay of conductive material extending from one edge of the mounting structure to a particular edge of the recess in which the wafer is disposed which is adjacent to the strip of electrically conductive material on the wafer. Means are provided making electrical contact between the overlay of electrically conductive material on the surface of the mounting structure and the strip of electrically conductive material on the wafer.

Additional objects of the invention, its advantages, scope and the manner in which it may be practiced will be readily apparent to persons conversant with the art from the following description of a presently preferred embodiment thereof, taken in conjunction with the subjoined claims and the annexed drawings in which like parts are designated with like reference characters throughout the several views and FIGURE 1 is a perspective elevational view of a fragment of a plate of semiconductor material having a plurality of mesa-type structures formed on its upper surface;

Figure 1:
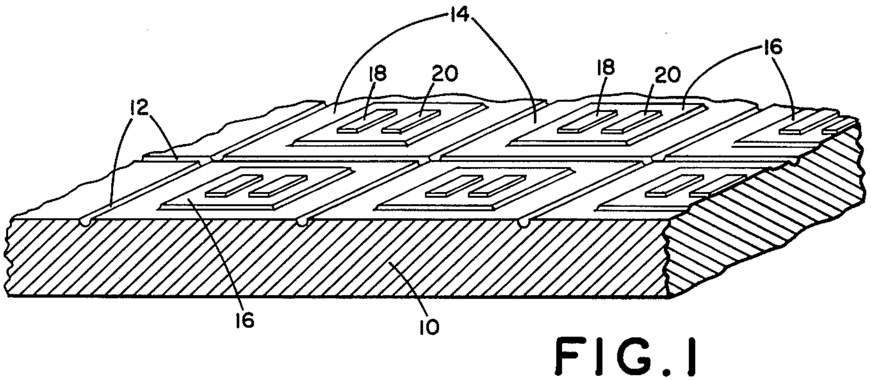
Figure 2:
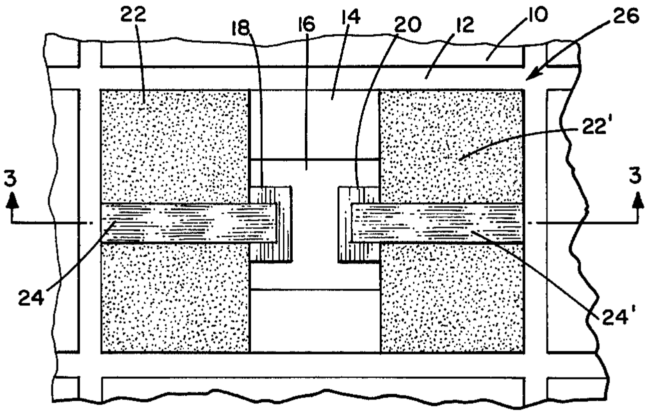
FIGURE 2 is a top plan view of a portion of the structure illustrated in FIGURE 1 subsequent to the performance of one of the initial steps of the method contemplated by the present invention.
Figure 3:
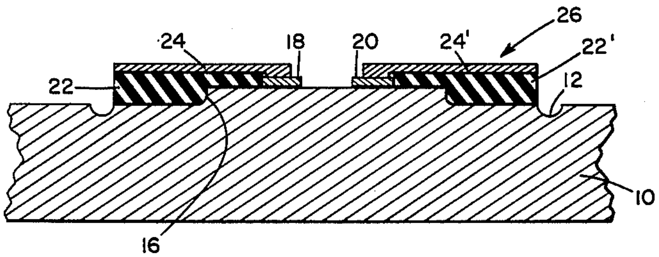
FIGURE 3 is a sectional view on line 3—3 of FIGURE 2 looking in the direction of the arrows.
Figure 4:
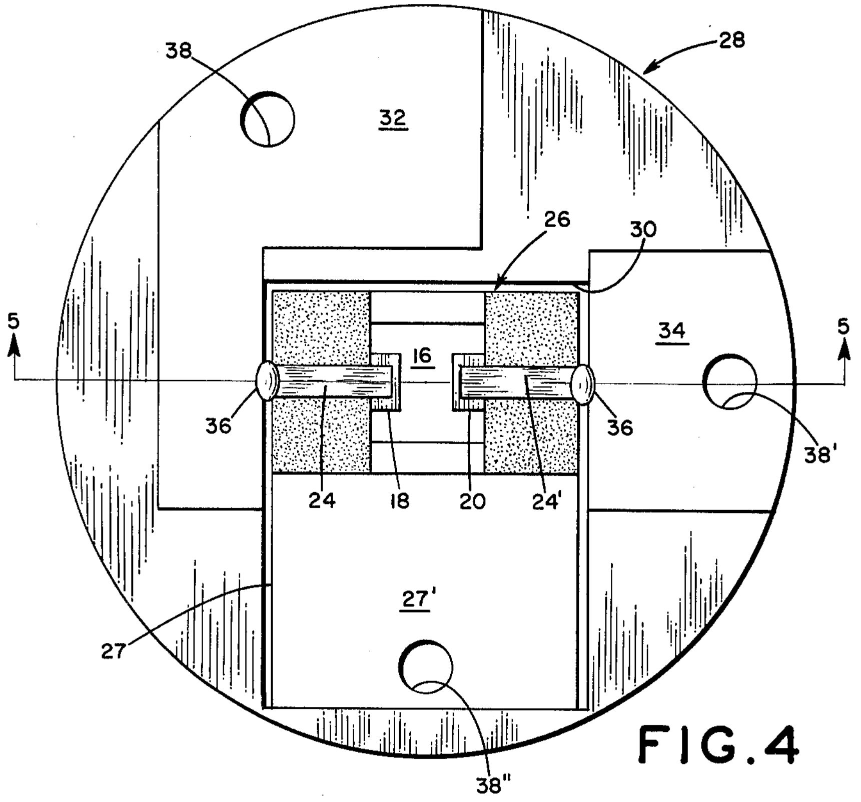
FIGURE 4 is a top plan view of a single semiconductor device and its mounting structure as contemplated by the present invention.

Referring now to the drawings, all of which are on a greatly enlarged scale, FIGURE 1 illustrates a fragment of a plate 10 of semiconductor material which may consist of a slice cut from a single crystal ingot having the conductivity characteristic required for the particular device to be fabricated. For the purposes of example it will be assumed that the devices to be fabricated are of the type generally referred to as "mesa" transistors and that plate 10 is P-type germanium or silicon.

As appears in the drawings one major face of plate 10 is provided with a plurality of intersecting grooves or depressions 12 of substantial depth forming a grid or network which subdivides the surface of the plate into a plurality of individual coplanar regions 14 of suitable shape and area for the fabrication of semiconductor devices. In commercial practice the complete slice of semiconductor material might have a diameter of about 25 millimeters and, for the production of mesa transistors, be subdivided into individual surface regions 14 of about 0.5 x 1.0 millimeter.

On each surface region 14 is a mesa 16 having a very thin base layer (not shown) of conductivity-type opposite to that of the bulk material of plate 10; atop the mesa are a pair of tiny electrodes 18, 20. In the assumed example and illustrated embodiment, one of these electrodes, say 18, would serve as an emitter and, therefore, would make rectifying junction contact with the base layer. The other electrode 20, would serve as the base connection and, accordingly, would make ohmic contact with the base layer.

Various techniques for the fabrication of mesa transistor devices are known in the art and may be employed. A suitable technique is disclosed in Patent No. 2,899,395 which issued on June 19, 1959 to J. W. Lathrop et al. A preferred method, however, is disclosed in the previously mentioned copending application Serial No. 83,726 (now abandoned) to which reference may be had for further details as to the method of fabricating plate 10, forming the base layer, and applying electrodes 18 and 20.

In accordance with the present invention a thin coating of electrically insulating material is applied to individual surface regions 14. The coating on each region is contiguous with the electrodes thereon terminating precisely at an edge of the electrode or overlapping the edge if desired. The coating extends from the electrode toward what will ultimately be the edge of the wafer in the completed device.

In the illustrated embodiment involving a mesa transistor structure, each surface region of the semiconductor plate is provided with an insulating coating in the form of two distinct surface segments 22 and 22' disposed on opposite sides of the mesa and each contiguous with an outer edge of a respective electrode 18, 20.

The insulating coating is conveniently applied by vapor deposition using appropriately apertured masks. As a specific example, the layer may take the form of silicon oxide or dioxide vaporized at a plate temperature of about 280° C. to a thickness of of about 5 microns. This forms a dense tenacious coating free of pores or other discontinuities.

It will be understood, of course, that the entire surface of the semiconductor plate 10 may be covered with an insulating layer provided only that a substantial portion of each of the electrodes remains exposed. The segmented coating, however, is necessary to avoid individual masking of each electrode. On the other hand, the insulating layer can be produced in other ways, some of which would not involve masking. Thus, for example, in the case where the semiconductor material is silicon, the coating can be produced in situ by thermal decomposition of the entire exposed surface area of the plate 10. For a disclosure of such a decomposition process reference is made to "A Double Diffused Silicon High-Frequency Switching Transistor Produced by Oxide Masking Techniques," J. F. Aschner et al., Journal of the Electrochemical Society, vol. 106 (1959), pages 415–417 and also to U.S. Patent No. 2,802,760 which issued on August 13, 1957, to L. Derick et al.

The next step of the method involves the provision of conductive strips 24, 24' overlaying insulating coating segments 22, 22', respectively. Each strip has one end in contact with a respective exposed portion of an electrode 18, 20 and extends from the electrode across the corresponding segment of the insulating coating.

Conductive strips 24, 24' are formed preferably by the vapor deposition of metals of high conductivity such as silver, gold or copper using suitable masks to confine the deposition to the selected areas. These metals may be vapor deposited without heating the semiconductor plate.

Figure 6:
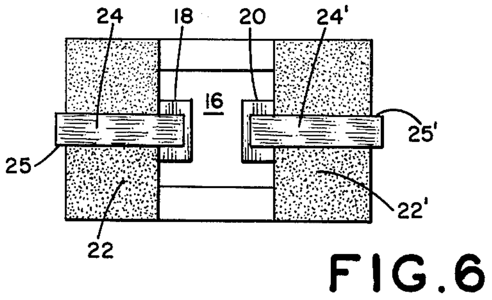
FIGURE 6 is a top plan view of a single semiconductor unit at an intermediate stage of fabrication and illustrating a slightly modified form of the unit.

Formed in this way conductive strips 24, 24' terminate flush with the edge of the die or wafer of the semiconductive device when it is ultimately subdivided from plate 10. A modified technique for forming the conductive strips may be employed, if desired, to provide a projecting tab of the conductive material for use in making terminal connections. The modified step involves filling depressions 12 with a thermoplastic material prior to deposition of the conductive strips. The mask used in deposition of the conductive material is designed to extend strips 24, 24' over the filled depressions so that when the thermoplastic material is removed and the plate ultimately subdivided, as hereinafter described, the segments of the conductive strips extending across the depressions remain to form connection tabs 25, 25' as shown in FIGURE 6.

After application of conductive strips 24, 24' the entire surface of plate 10, including all individual surface regions 14, electrodes 18, 20 and the conductive strips can be provided with a protective insulating coating (not shown) as by the vapor deposition thereon of a thin layer of silicon dioxide, provided only that the extreme outer ends of the conductive strips are left exposed in the event that the step providing projecting tabs 25, 25' is not employed.

The entire surface of plate 10, carrying the respective individual transistor structures 26 is then coated with an etch-proof material such as pitch. This material is applied in a relatively thick continuous coating over the entire surface so that depressions 12 are completely filled.

The opposite surface of semiconductor plate 10, i.e., the area not covered with the etch-proof material, is then subjected to a suitable etching treatment. The etching treatment is prolonged until the semiconductor plate is etched away down to the pitch-filled depression, the entire bulk of plate 10 being dissolved except for the individual segments associated with the transistor structures.

At this stage the individual units 26 are effectively separated but remain embedded in the layer of pitch or other etch-resistant material and, in this condition, are treated en masse to form collector electrodes on the etched surfaces. The thickness portion of the original semiconductor material between the etched surface and the base layer serves as the collector region making rectifying junction contact with the base layer.

The collector electrode is formed by applying to the etched surfaces a conductive material making ohmic contact therewith. To provide an ohmic contact the material selected should have the same conductivity-type as the original semiconductor plate. In the assumed example of a P-type germanium plate, an alloy of indium and gallium or tin and gallium may be employed to advantage. For a semiconductor plate of P-type silicon, pure gallium or aluminum is suitable. The electrode-forming acceptor material is applied by vapor deposition.

Upon removal of the etch-proof material, as by use of a suitable solvent, the individual devices 26 are separated into distinct entities and are handled separately from this point.

Fabrication of the devices is completed by placing each with its collector electrode against a separate strip of metal foil 27 (FIGURE 5) and heating to a relatively low temperature sufficient only to bond the sheet in non-rectifying contact with the electrode.

Foil sheet 27 is larger in one dimension than the wafer of the semiconductor device so that a tab 27' projects beyond one edge of the wafer for providing a terminal connection for the collector as will appear presently.

The individual devices now have emitter, base, and collector electrodes provided with suitable contacts and are ready for mounting.

A transistor mounting structure 28 is provided which consists basically of a sandwich of two plates 28*a* and 28*b* of insulating material, e.g., plastic or the like. In the illustrated embodiment, plates 28*a*, 28*b* are shown to be of circular configuration and will be referred to as such in the following description. It will be appreciated, however, that while the circular form would probably be the most convenient in practically all cases, any other shape can be used.

Figure 5:
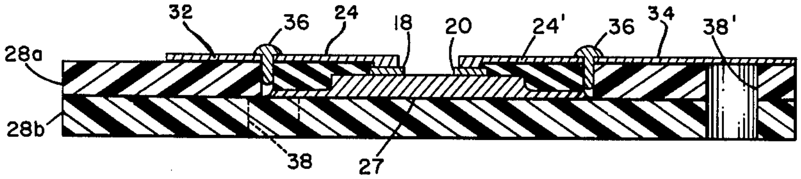
FIGURE 5 is a sectional view taken on line 5—5 of FIGURE 4.

Upper plate 28*a* of the housing structure contains an aperture 30 adapted by reason of configuration and dimension to receive an individual transistor unit 26 resulting from fabriaction in the manner just described. As best seen in FIGURE 5, aperture 30 is preferably proportioned and located so that transistor unit 26 is disposed centrally of the mounting structure with the collector foil tab 27′ extending radially outward toward its circumference.

The upper surface of apertured mounting plate 28*a* is metallized or otherwise provided with a pair of electrically conductive strips 32, 34 extending from respective edges of aperture 30 to the perimeter of the plate. It will be observed that metal strips 32 and 34 are oriented with respect to aperture 30 and, therefore, to the position established thereby for the transistor it receives, so that each strip terminates adjacent a respective edge of the transistor where conductive strips 24, 24′ extend to the edge of the semiconductor wafer.

The depth of aperture 30 is selected so that the respective surfaces of the various conductive strips 24, 24′, 32, and 34 are substantially coplanar when the transistor is installed in mounting structure 28.

Once the transistor is placed in aperture 30 of upper mounting plate 28*a*, connection of terminal strips 32, 34 to the emitter and base electrodes 18, 20 is easily accomplished by placing a drop of solder 36 at the points where the conductive strips 24, 24′ on the transistor device and the terminal strips 32, 34 on the housing structure are juxtaposed. If it is desired to avoid the use of the temperatures involved in making a soldered connection, a drop of conductive paint, silver-loaded epoxy resin or the like can be used instead. Moreover, where the transistor device is of the configuration shown in FIGURE 6 (i.e., having projecting tabs 25, 25′) these tabs extend over adjacent portions of terminal strips 32, 34 on the housing structure which permits a further alternative in the technique employed for making the connections, viz., a spot weld can be employed. It should be noted that any heat or pressure applied to tabs 25, 25′ in this case would not involve the transistor unit proper and, consequently, there is no risk of deleteriously affecting the transistor operating characteristics as in the case where contacts are bonded to the device itself by thermal compression.

At suitable locations where terminal strips 32, 34 and foil strip 27′ extend to or approach the circumferential edge of mounting plate 28*a*, housing structure 28 is provided with holes 38, 38′, 38″ for the reception of pins or prongs (not shown) contacting strips 32, 34 and 27′, respectively, and adapting the transistor device for installation in an appropriate socket receptacle.

The invention has been described as applied to PNP structures, that is, where an N-type base layer is formed on a P-type wafer and a P-type region formed on the base layer. To obtain particularly low inner-electrode capacitance, a PNIP or NPIN structure can be employed so that that is an intrinsic region between the base layer and the collector. Such a structure can be achieved by use of known epitaxial techniques such as disclosed in "Epitaxial Diffused Transistors," H. C. Theuerer et al., Proceedings of the Institute of Radio Engineers, vol. 48 (1960), pages 1642–1643 and in "Epitaxial Silicon Films by the Hydrogen Reduction of $SiCl_4$," H. C. Theuerer, Journal of the Electrochemical Society, vol. 108 (1961), pages 649–653.

While there have been described what at present are believed to be the preferred embodiments of this invention, it will be obvious to those skilled in the art that various changes and modifications may be made therein without departing from the invention, and it is aimed, therefore, to cover in the appended claims all such changes and modifications as fall within the true spirit and scope of the invention.

What is claimed and desired to be secured by United States Letters Patent is:

1. A fabrication method for semiconductor devices comprising: providing a plate of semiconductor material having depressions in a major surface subdividing said surface into a plurality of individual coplanar surface regions delimited and mutually segregated by said depressions and further having on each said surface region at least one operating electrode; providing an insulating coating on said surface regions contiguous with the respective electrodes thereon while leaving at least a substantial portion of each of said electrodes exposed; applying atop said insulating coating a respective strip of electrically-conductive material contacting each of said electrodes and extending toward an edge of the respective surface regions; coating the entire said major surface with an etch-resistant material; etching the exposed opposite surface of said semiconductor plate until the etch-resistant material in said depressions is reached, whereby said plate is effectively separated into discrete segments; and applying ohmic contacts to the respective etched surfaces of said discrete plate segments.

2. A fabrication method for semiconductor devices, comprising: providing a plate of semiconductor material having depressions in a major surface subdividing said surface into a plurality of individual coplanar surface regions delimited and mutually segregated by said depressions and having on each said surface region spaced operating electrodes; forming an insulating coating on said surface regions contiguous with each electrode on said regions while leaving at least a substantial portion of each said electrode exposed; applying atop said insulating coating a thin strip of electrically conductive material for each said electrode, each strip having one end in contact with a respective electrode and extending toward an edge of the respective surface region; coating the entire said major surface with an etch-resistant material; etching the opposite major surface of said semi-conductor plate until the etch-resistant material in said depressions is reached, whereby said plate is effectively separated into discrete segments; and applying ohmic contacts to the respective etched surfaces of said discrete plate segments.

3. A fabrication method for semiconductor devices, comprising: providing a plate of semiconductor material having depressions on a major surface subdividing said surface into a plurality of individual coplanar surface regions delimited and mutually segregated by said depressions and having on each said surface region a layer of different conductivity characteristics with respect to said semiconductor material, and further having on each said surface at least one electrode making ohmic contact and at least one electrode making rectifying junction contact with said layer; forming an insulating coating on said surface regions including respective coating segments contiguous with each of said electrodes while leaving at least a substantial portion thereof exposed; applying atop said insulating coating a strip of electrically-conductive material contacting said region and extending at least to the edge of one of the depressions in said surface; coating said surface with an etch resistant material; then etching the exposed surface of said semiconductor plate until the etch resistant material in said depressions is reached, whereby said plate is effectively separated into discrete segments; applying ohmic contacts to the respective etched surfaces of said discrete plate segments.

4. For the mass production of semiconductor devices in which a thin layer having a particular conductivity characteristic is formed on one surface of a semiconductor wafer having a different conductivity characteristic; and at least one ohmic and one rectifying electrode are provided on said layer, a fabrication method comprising: providing a plate of semiconductor material of a particular conductivity characteristic and having an area sufficient to the formation of relatively large numbers of such a wafer; forming depressions on a major surface of said plate subdividing said surface into a plurality of individual coplanar surface regions, each corresponding in size and shape to such a wafer, delimited and mutually segregated by said depressions; forming on each of said surface regions a thin layer having a conductivity characteristic different from that of said semiconductor material; applying to the layer on each of said surface regions a respective ohmic contact electrode and rectifying junction contact electrode so as to form respective semiconductor device assemblies; applying to said surface regions a coating of insulating material contiguous with but leaving major portions of said electrodes exposed and extending to at least two edges of said regions; applying atop said insulating coating an electrically conductive strip for each electrode having one end in contact with the electrode and the other end extending at least to an edge of the surface region on which it is disposed; applying to said one major surface of the semiconductor plate, in its entirety a substantially continuous coating of an etch-resistant material, said material filling said depressions; etching the exposed surface of said semiconductor plate until the etch-resistant material in said depressions is reached, whereby said plate is effectively separated into discrete segments; removing said etch-resistant material to complete the physical separation of said assemblies; and bonding with ohmic contact to the surface of each said plate segment opposite said layer, a strip of foil extending beyond one edge of the plate segment to form a connection tab.

5. A method according to claim 4 wherein said insulating coating is applied by vapor deposition of an oxide selected from the group consisting of silicon oxide and silicon dioxide while said plate of semiconductor is heated to a temperature of about 280° C.

6. A method according to claim 4 wherein said semiconductor material is silicon and said insulating coating is applied by thermal decomposition.

7. A method according to claim 4 wherein the conductive strips are applied by vapor deposition of a metal of high electrical conductivity.

8. A method according to claim 7 wherein the conductive strips are formed by vapor deposition and the metal is selected from the class consisting of copper, silver and gold.

9. A method according to claim 4 wherein a protective insulating coating is applied to said surface regions after application of the conductive strips leaving exposed the ends of said strips remote from said electrodes.

References Cited by the Examiner

UNITED STATES PATENTS

| | | |
|---|---|---|
| 2,629,802 | 2/53 | Pantchechnikoff. |
| 2,725,505 | 11/55 | Webster. |
| 2,890,395 | 6/59 | Lathrop. |
| 2,921,362 | 1/60 | Nomura. |
| 2,972,092 | 2/61 | Nelson. |
| 2,981,877 | 4/61 | Noyce. |
| 3,074,145 | 1/63 | Rowe. |

RICHARD H. EANES, Jr., *Primary Examiner.*

JAMES D. KALLAM, *Examiner.*